US006246083B1

(12) United States Patent
Noble

(10) Patent No.: US 6,246,083 B1
(45) Date of Patent: Jun. 12, 2001

(54) VERTICAL GAIN CELL AND ARRAY FOR A DYNAMIC RANDOM ACCESS MEMORY

(75) Inventor: Wendell P. Noble, Milton, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/028,807

(22) Filed: Feb. 24, 1998

(51) Int. Cl.⁷ ................................................. H01L 27/108
(52) U.S. Cl. ........................ 257/296; 257/301; 257/304
(58) Field of Search .................................. 257/302, 296, 257/301, 304, 305

(56) References Cited

U.S. PATENT DOCUMENTS

| 4,051,354 | 9/1977 | Choate ................................. 235/312 |
| 4,604,162 | 8/1986 | Sobczak et al. ..................... 156/657 |
| 4,663,831 | 5/1987 | Birrittella et al. ................. 29/576 E |
| 4,673,962 | 6/1987 | Chatterjee et al. ................. 357/23.6 |
| 4,761,768 | 8/1988 | Turner et al. ....................... 365/201 |
| 4,766,569 | 8/1988 | Turner et al. ....................... 365/185 |
| 4,920,065 | 4/1990 | Chin et al. ............................ 437/52 |
| 4,958,318 | 9/1990 | Harari ................................... 365/149 |
| 4,987,089 | 1/1991 | Roberts ................................. 437/34 |
| 5,001,526 | 3/1991 | Gotou ................................. 357/23.6 |
| 5,017,504 | 5/1991 | Nishimuro et al. ..................... 437/40 |
| 5,021,355 | 6/1991 | Dhong et al. ........................... 437/35 |
| 5,028,977 | 7/1991 | Kenneth et al. ....................... 357/43 |
| 5,057,896 | 10/1991 | Gotou ................................. 257/296 |
| 5,102,817 | 4/1992 | Chatterjee et al. .................... 437/47 |
| 5,110,752 | 5/1992 | Lu ......................................... 437/47 |
| 5,156,987 | 10/1992 | Sandhu et al. ........................ 437/40 |
| 5,177,028 | 1/1993 | Manning ............................... 437/41 |
| 5,202,278 | 4/1993 | Mathews et al. ....................... 437/47 |
| 5,208,657 | 5/1993 | Chatterjee et al. ................... 257/302 |

(List continued on next page.)

OTHER PUBLICATIONS

Terauchi, M., et al., "A Surrounding Gate Transistor (SGT) Gain Cell for Ultra High Density DRAMs", 1993 Symposium on VLSI Technology, Digest of Technical Papers, Kyoto, Japan, 21–22, (1993).

Adler, E., et al., "The Evolution of IBM CMOS DRAM Technology", *IBM Journal of Research and Development*, 39, 167–188, (Jan./Mar. 1995).

(List continued on next page.)

*Primary Examiner*—Roy Potter
(74) *Attorney, Agent, or Firm*—Schwegman, Lundberg, Woessner & Kluth, P.A.

(57) ABSTRACT

A vertical gain memory cell including an n-channel metal-oxide semiconductor field-effect transistor (MOSFET) and p-channel junction field-effect transistor (JFET) transistors formed in a vertical pillar of semiconductor material is provided. The body portion of the p-channel transistor is coupled to a second source/drain region of the MOSFET which serves as the gate for the JFET. The second source/drain region of the MOSFET is additionally coupled to a charge storage node. Together the second source/drain region and charge storage node provide a bias to the body of the JFET that varies as a function of the data stored by the memory cell. A non destructive read operation is achieved. The stored charge is sensed indirectly in that the stored charge modulates the conductivity of the JFET so that the JFET has a first turn-on threshold for a stored logic "1" condition and a second turn-on threshold for a stored logic "0" condition. The charge storage node is a plate capacitor which surrounds the second source/drain region of the MOSFET. The vertical gain cell is fabricated so that the write word line, read bit line, read word line and capacitor are buried beneath the silicon surface. As a result the cell can be fabricated in an area as small as four (4) lithographic feature squares.

19 Claims, 10 Drawing Sheets

U.S. PATENT DOCUMENTS

| | | | |
|---|---|---|---|
| 5,216,266 | 6/1993 | Ozaki | 257/302 |
| 5,266,514 | 11/1993 | Tuan et al. | 437/52 |
| 5,320,880 | 6/1994 | Sandhu et al. | 427/578 |
| 5,327,380 | 7/1994 | Kersh, III et al. | 365/195 |
| 5,376,575 | 12/1994 | Kim et al. | 437/52 |
| 5,391,911 | 2/1995 | Beyer et al. | 257/522 |
| 5,392,245 | 2/1995 | Manning | 365/200 |
| 5,393,704 | 2/1995 | Huang et al. | 437/203 |
| 5,396,093 | 3/1995 | Lu | 257/306 |
| 5,410,169 | 4/1995 | Yamamoto et al. | 257/301 |
| 5,414,287 | 5/1995 | Hong | 257/316 |
| 5,422,499 | 6/1995 | Manning | 257/67 |
| 5,432,739 | 7/1995 | Pein | 365/185 |
| 5,438,009 | 8/1995 | Yang et al. | 437/52 |
| 5,440,158 | 8/1995 | Sung-Mu | 257/314 |
| 5,445,986 | 8/1995 | Hirota | 437/60 |
| 5,460,316 | 10/1995 | Hefele | 228/39 |
| 5,460,988 | 10/1995 | Hong | 437/43 |
| 5,466,625 | 11/1995 | Hsieh et al. | 437/52 |
| 5,483,094 | 1/1996 | Sharma et al. | 257/316 |
| 5,483,487 | 1/1996 | Sung-Mu | 365/185.33 |
| 5,492,853 | 2/1996 | Jeng et al. | 437/60 |
| 5,495,441 | 2/1996 | Hong | 365/185.01 |
| 5,497,017 | 3/1996 | Gonzales | 257/306 |
| 5,504,357 | 4/1996 | Kim et al. | 257/306 |
| 5,508,219 | 4/1996 | Bronner et al. | 437/52 |
| 5,508,542 | 4/1996 | Geiss et al. | 257/301 |
| 5,528,062 | 6/1996 | Hsieh et al. | 257/298 |
| 5,563,083 | 10/1996 | Pein | 437/43 |
| 5,593,912 | 1/1997 | Rajeevakumar | 437/52 |
| 5,616,934 | 4/1997 | Dennison et al. | 257/67 |
| 5,640,342 | 6/1997 | Gonzalez | 365/156 |
| 5,644,540 | 7/1997 | Manning | 365/200 |
| 5,646,900 | 7/1997 | Tsukude et al. | 365/205 |
| 5,691,230 | 11/1997 | Forbes | 437/62 |
| 5,705,415 | 1/1998 | Orlowski et al. | 437/43 |
| 5,909,618 | 6/1999 | Forbes et al. | 438/242 |
| 5,914,511 * | 6/1999 | Noble et al. | 257/302 |

OTHER PUBLICATIONS

Asai, S., et al., "Technology Challenges for Integration Near and Below 0.1 μm", Proceedings of the IEEE, 85, Special Issue on Nanometer–Scale Science & Technology, 505–520, (Apr. 1997).

Banerjee, S.K., et al., "Characterization of Trench Transistors for 3–D Memories", 1986 Symposium on VLSI Technology, Digest of Technical Papers, San Diego, CA, 79–80, (May 28–30, 1986).

Blalock, T.N., et al., "A High–Speed Sensing Scheme for 1T Dynamic RAM's Utilizing the Clamped Bit–Line Sense Amplifier", *IEEE Journal of Solid–State Circuits*, 27, 618–625, (Apr. 1992).

Bomchil, G., et al., "Porous Silicon: The Material and its Applications in Silicon–On–Insulator Technologies", *Applied Surface Science*, 41/42, 604–613, (1989).

Burnett, D., et al., "Implications of Fundamental Threshold Voltage Variations for High–Density SRAM and Logic Circuits", 1994 Symposium on VLSI Technology, Digest of Technical Papers, Honolulu, HI, 15–16, (Jun. 4–7, 1994).

Burnett, D., et al., "Statistical Threshold–Voltage Variation and its Impact on Supply–Voltage Scaling", Proceedings SPIE: Microelectronic Device, and Multilevel Interconnection Technology, 2636, 83–90, (1995).

Chen, M.J., et al., "Back–Gate Forward Bias Method for Low–Voltage CMOS Digital Circuits", *IEEE Transactions on Electron Devices*, 43, 904–909, (Jun. 1986).

Chen, M.J., et al., "Optimizing the Match in Weakly Inverted MOSFET's by Gated Lateral Bipolar Action", *IEEE Transactions on Electron Devices*, 43, 766–773, (May 1996).

Chung, I.Y., et al., "A New SOI Inverter for Low Power Applications", Proceedings of the 1996 IEEE International SOI Conference, Sanibel Island, FL, 20–21, (Sep. 30–Oct. 3, 1996).

De, V.K., et al., "Random MOSFET Parameter Fluctuation Limits to Gigascale Integration (GSI)", 1996 Symposium on VLSI Technology, Digest of Technical Papers, Honolulu, HI, 198–199, (Jun. 11–13, 1996).

Denton, J.P., et al., "Fully Depleted Dual–Gated Thin–Film SOI P–MOSFET's Fabricated in SOI Islands with an Isolated Buried Polysilicon Backgate", *IEEE Electron Device Letters*, 17, 509–511, (Nov. 1996).

Fong, Y., et al., "Oxides Grown on Textured Single–Crystal Silicon—Dependence on Process and Application in EEPROMs", *IEEE Transactions on Electron Devices*, 37, 583–590, (Mar. 1990).

Fuse, T., et al., "A 0.5V 200 MHz 1–Stage 32b ALU Using a Body Bias Controlled SOI Pass–Gate Logic", 1997 IEEE International Solid–State Circuits Conference, Digest of Technical Papers, 286–287, (1997).

Gong, S., et al., "Techniques for Reducing Switching Noise in High Speed Digital Systems", Proceedings of the 8th Annual IEEE International ASIC Conference and Exhibit, 21–24, (1995).

Hao, M.Y., et al., "Electrical Characteristics of Oxynitrides Grown on Textured Single–Crystal Silicon", *Appl. Phys. Lett.*, 60, 445–447, (Jan. 1992).

Harada, M., et al., "Suppression of Threshold Voltage Variation in MTCMOS/SIMOX Circuit Operating Below 0.5 V", 1996 Symposium on VLSI Technology, Digest of Technical Papers, Honolulu, HI, 96–97, (Jun. 11–13, 1996).

Hisamoto, D., et al., "A New Stacked Cell Structure for Giga–Bit DRAMs using Vertical Ultra–Thin SOI (DELTA) MOSFETs", 1991 IEEE International Electron Devices Meeting, Technical Digest, Washington, D.C., 959–961, (Dec. 8–11, 1991).

Hodges, D.A., et al., "MOS Decoders", In: *Analysis of Digital Integrated Circuits*, 2nd Edition, McGraw–Hill Book Co., New York, 354–357, (1988).

Holman, W.T., et al., "A Compact Low Noise Operational Amplifier for a 1.2 μm Digital CMOS Technology", *IEEE Journal of Solid–State Circuits*, 30, 710–714, (Jun. 1995).

Hu, G., et al., "Will Flash Memory Replace Hard Disk Drive?", 1994 IEEE International Electron Device Meeting, Panel Discussion, Session 24, Outline, 1 p., (Dec. 13, 1994).

Huang, W.L., et al., "TFSOI Complementary BiCMOS Technology for Low Power Applications", *IEEE Transactions on Electron Devices*, 42, 506–512, (Mar. 1995).

Jun, Y.K., et al., "The Fabrication and Electrical Properties of Modulated Stacked Capacitor for Advanced DRAM Applications", *IEEE Electron Device Letters*, 13, 430–432, (Aug. 1992).

Jung, T.S., et al., "A 117–mm$^2$ 3.3–V Only 128–Mb Multilevel NAND Flash Memory for Mass Storage Applications", *IEEE Journal of Solid–State Circuits*, 31, 1575–1582, (Nov. 1996).

Kang, H.K., et al., "Highly Manufacturable Process Technology for Reliable 256 Mbit and 1Gbit DRAMs", IEEE International Electron Devices Meeting, Technical Digest, San Francisco, CA, 635–638, (Dec. 11–14, 1994).

Kim, Y.S., et al., "A Study on Pyrolysis DMEAA for Selective Deposition of Aluminum", In: *Advanced Metallization and Interconnect Systems for ULSI Applications in 1995*, R.C. Ellwanger, et al., (eds.), Materials Research Society, Pittsburgh, PA, 675–680, (1996).

Kishimoto, T., et al., "Well Structure by High–Energy Boron Implantation for Soft–Error Reduction in Dynamic Random Access Memories (DRAMs)", *Japanese Journal of Applied Physics*, 34, 6899–6902, (Dec. 1995).

Kohyama, Y., et al., "Buried Bit–Line Cell for 64 MB DRAMs", 1990 Symposium on VLSI Technology, Digest of Technical Papers, Honolulu, HI, 17–18, (Jun. 4–7, 1990).

Koshida, N., et al., "Efficient Visible Photoluminescence from Porous Silicon", *Japanese Journal of Applied Physics*, 30, L1221–L1223, (Jul. 1991).

Kuge, S., et al., "SOI–DRAM Circuit Technologies for Low Power High Speed Multigiga Scale Memories", *IEEE Journal of Solid–State Circuits*, 31, 586–591, (Apr. 1996).

Lantz, II, L., "Soft Errors Induced By Alpha Particles", *IEEE Transactions on Reliability*, 45, 174–179, (Jun. 1996).

Lehmann, V., "The Physics of Macropore Formation in Low Doped n–Type Silicon", *J. Electrochem. Soc.*, 140, 2836–2843, (Oct. 1993).

Lu, N., et al., "The SPT Cell—A New Substrate–Plate Trench Cell for DRAMs", 1985 IEEE International Electron Devices Meeting, Technical Digest, Washington, D.C., 771–772, (Dec. 1–4, 1985).

MacSweeney, D., et al., "Modelling of Lateral Bipolar Devices in a CMOS Process", IEEE Bipolar Circuits and Technology Meeting, Minneapolis, MN, 27–30, (Sep. 1996).

Maeda, S., et al., "A Vertical Φ–Shape Transistor (VΦT) Cell for 1 Gbit DRAM and Beyond", 1994 Symposium on VLSI Technology, Digest of Technical Papers, Honolulu, HI, 133–134, (Jun. 7–9, 1994).

Maeda, S., et al., "Impact of a Vertical Φ–Shape Transistor (VΦT) Cell for 1 Gbit Dram and Beyond", *IEEE Transactions on Electron Devices*, 42, 2117–2123, (Dec. 1995).

Nitayama, A., et al., "High Speed and Compact CMOS Circuits with Multipillar Surrounding Gate Transistors", *IEEE Transactions on Electron Devices*, 36, 2605–2606, (Nov. 1989).

Ohno, Y., et al., "Estimation of the Charge Collection for the Soft–Error Immunity by the 3D–Device Simulation and the Quantitative Investigation", *Simulation of Semiconductor Devices and Processes*, 6, 302–305, (Sep. 1995).

Oowaki, Y., et al., "New α–Particle Induced Soft Error Mechanism in a Three Dimensional Capacitor Cell", *IEICE Transactions on Electronics*, 78–C, 845–851, (Jul. 1995).

Oshida, S., et al., "Minority Carrier Collection in 256 M–bit DRAM Cell on Incidence of Alpha–Particle Analyzed by Three–Dimensional Device Simulation", *IEICE Transactions on Electronics*, 76–C, 1604–1610, (Nov. 1993).

Ozaki, T., et al., "A Surrounding Isolation–Merged Plate Electrode (SIMPLE) Cell with Checkered Layout for 256Mbit DRAMs and Beyond", 1991 IEEE International Electron Devices Meeting, Washington, D.C., 469–472, (Dec. 8–11, 1991).

Parke, S.A., et al., "A High–Performance Lateral Bipolar Transistor Fabricated on SIMOX", *IEEE Electron Devices Letters*, 14, 33–35, (Jan. 1993).

Pein, H., et al., "A 3–D Sidewall Flash EPROM Cell and Memory Array", *IEEE Transactions on Electron Devices*, 40, 2126–2127, (Nov. 1993).

Pein, H., et al., "Performance of the 3–D PENCIL Flash EPROM Cell and Memory Array", *IEEE Transactions on Electron Devices*, 42, 1982–1991, (Nov., 1995).

Pein, H.B., et al., "Performance of the 3–D Sidewall Flash EPROM Cell", IEEE International Electron Devices Meeting, Technical Digest, 11–14, (1993).

Rao, K.V., et al., "Trench Capacitor Design Issues in VLSI DRAM Cells", 1986 IEEE International Electron Devices Meeting, Technical Digest, Los Angeles, CA, 140–143, (Dec. 7–10, 1986).

Richardson, W.F., et al., "A Trench Transistor Cross–Point DRAM Cell", 1985 IEEE International Electron Devices Meeting, Washington, D.C., 714–717, (Dec. 1–4, 1985).

Sagara, K., et al., "A 0.72 $\mu m^2$ Recessed STC (RSTC) Technology for 256Mbit DRAMs using Quarter–Micron Phase–Shift Lithography", 1992 Symposium on VLSI Technology, Digest of Technical Papers, Seattle, WA, 10–11, (Jun. 2–4, 1992).

Saito, M., et al., "Technique for Controlling Effective Vth in Multi–Gbit DRAM Sense Amplifier", 1996 Symposium on VLSI Circuits, Digest of Technical Papers, Honolulu, HI, 106–107, (Jun. 13–15, 1996).

Shah, A.H., et al., "A 4–Mbit DRAM with Trench–Transistor Cell", *IEEE Journal of Solid–State Circuits*, SC–21, 618–625, (Oct. 1986).

Shah, A.H., et al., "A 4Mb DRAM with Cross–Point Trench Transistor Cell", 1986 IEEE International Solid–State Circuits Conference, Digest of Technical Papers, 268–269, (Feb. 21, 1986).

Sherony, M.J., et al., "Reduction of Threshold Voltage Sensitivity in SOI MOSFET's", *IEEE Electron Devices Letters*, 16, 100–102, (Mar. 1995).

Shimomura, K., et al., "A 1V 46ns 16Mb SOI–DRAM with Body Control Technique", 1997 IEEE International Solid-State Circuits Conference, Digest of Technical Papers, 68–69, (Feb. 6, 1997).

Stellwag, T.B., et al., "A Vertically–Integrated GaAs Bipolar DRAM Cell", *IEEE Transactions on Electron Devices*, 38, 2704–2705, (Dec. 1991).

Suma, K., et al., "An SOI–DRAM with Wide Operating Voltage Range by CMOS/SIMOX Technology", *IEEE Journal of Solid–State Circuits*, 29, 1323–1329, (Nov. 1994).

Sunouchi, K., et al., "A Surrounding Gate Transistor (SGT) Cell for 64/256Mbit DRAMs", 1989 IEEE International Electron Devices Meeting, Technical Digest, Washington, D.C., 23–26, (Dec. 3–6, 1989).

Sunouchi, K., et al., "Process Integration for 64M DRAM Using an Asymmetrical Stacked Trench Capacitor (AST) Cell", 1990 IEEE International Electron Devices Meeting, San Francisco, CA, 647–650, (Dec. 9–12, 1990).

Takai, M., et al., "Direct Measurement and Improvement of Local Soft Error Susceptibility in Dynamic Random Access Memories", *Nuclear Instruments & Methods in Physics Research*, B–99, Proceedings of the 13th International Conference on the Application of Accelerators in Research and Industry, Denton, TX, 562–565, (Nov. 7–10, 1994).

Takato, H., et al., "High Performance CMOS Surrounding Gate Transistor (SGT) for Ultra High Density LSIs", 1998 IEEE International Electron Devices Meeting, Technical Digest, 222–225, (1988).

Takato, H., et al., "Impact of Surrounding Gate Transistor (SGT) for Ultra–High Density LSI's", *IEEE Transactions on Electron Devices*, 38 , 573–578, (Mar. 1991).

Tanabe, N., et al., "A Ferroelectric Capacitor Over Bit–Line (F–COB) Cell for High Density Nonvolatile Ferroelectric Memories", 1995 Symposium on VLSI Technology, Digest of Technical Papers, Kyoto, Japan, 123–124, (Jun. 6–8, 1995).

Temmler, D., "Multilayer Vertical Stacked Capacitors (MVSTC) for 64Mbit and 256Mbit DRAMs", 1991 Symposium on VLSI Technology, Digest of Technical Papers, Oiso, 13–14, (May 28–30, 1991).

Tsui, P.G., et al., "A Versatile Half–Micron Complementary BiCMOS Technology for Microprocessor–Based Smart Power Applications", *IEEE Transactions on Electron Devices*, 42, 564–570, (Mar. 1995).

Verdonckt–Vandebroek, S., et al., "High–Gain Lateral Bipolar Action in a MOSFET Structure", *IEEE Transactions on Electron Devices*, 38, 2487–2496, (Nov. 1991).

Wang, N., *Digital MOS Integrated Circuits,* Prentice Hall, Inc. , Englewood Cliffs, NJ, p. 328–333, (1989).

Wang, P.W., et al., "Excellent Emission Characteristics of Tunneling Oxides Formed Using Ultrathin Silicon Films for Flash Memory Devices", *Japanese Journal of Applied Physics*, 35, 3369–3373, (Jun. 1996).

Watanabe, H., et al., "A New Cylindrical Capacitor Using Hemispherical Grained Si (HSG–Si) for 256Mb DRAMs", IEEE International Electron Devices Meeting, Technical Digest, San Francisco, CA, 259–262, (Dec. 13–16, 1992).

Watanabe, H., et al, "A Novel Stacked Capacitor with Porous–Si Electrodes for High Density DRAMs", 1993 Symposium on VLSI Technology, Digest of Technical Papers, Kyoto, Japan, 17–18, (1993).

Watanabe, H., et al., "An Advanced Fabrication Technology of Hemispherical Grained (HSG) Poly–Si for High Capacitance Storage Electrodes", Extended Abstracts of the 1991 International Conference on Solid State Devices and Materials, Yokohama, Japan, 478–480, (1991).

Watanabe, H., et al., "Device Application and Structure Observation for Hemispherical–Grained Si", *J. Appl. Phys.,* 71, 3538–3543, (Apr. 1992).

Watanabe, H., et al., "Hemispherical Grained Silicon (HSG–Si) Formation on In–Situ Phosphorous Doped Amorphous–Si Using the Seeding Method", Extended Abstracts of the 1992 International Conference on Solid State Devices and Materials, Tsukuba, Japan, 422–424, (1992).

Watanabe, S., et al., "A Novel Circuit Technology with Surrounding Gate Transistors (SGT's) for Ultra High Density DRAM's", *IEEE Journal of Solid–State Circuits,* 30, 960–971, (Sep. 1995).

Yamada, T., et al., "A New Cell Structure with a Spread Source/Drain (SSD) MOSFET and a Cylindrical Capacitor for 64–Mb DRAM's", *IEEE Transactions on Electron Devices,* 38, 2481–2486, (Nov. 1991).

Yamada, T., et al., "Spread Source/Drain (SSD) MOSFET Using Selective Silicon Growth for 64Mbit DRAMs", 1989 IEEE International Electron Devices Meeting, Technical Digest, Washington, D.C., 35–38, (Dec. 3–6, 1989).

Yoshikawa, K., "Impact on Cell Threshold Voltage Distribution in the Array of Flash Memories on Scaled and Multilevel Flash Cell Design", 1996 Symposium on VLSI Technology, Digest of Technical Papers, Honolulu, HI, 240–241, (Jun. 11–13, 1996).

* cited by examiner

VERTICAL GAIN CELL AND ARRAY FOR A DYNAMIC RANDOM ACCESS MEMORY

FIELD OF THE INVENTION

The present invention relates generally to semiconductor memory devices. More particularly, it pertains to a vertical gain cell and array for a dynamic random access memory and method for forming the same.

BACKGROUND OF THE INVENTION

Integrated circuit technology relies on transistors to formulate vast arrays of functional circuits and memory cells. The functional demands placed on these circuits and memory cells require the use of an ever-increasing number of linked transistors. As the number of transistors required increases, the surface space on the silicon chip/die that is allocated to each transistor dwindles. It is desirable then, to construct transistors which occupy less surface area on the silicon chip/die.

Typically, the memory cells of dynamic random access memories (DRAMs) include two main components, a field-effect transistor (FET) and a capacitor which functions as a storage element. The need to increase the storage capability of semiconductor memory devices has led to the development of very large scale integrated (VLSI) processes capable of creating smaller and smaller features. This reduction of feature size provides a substantial increase in density of memory cells in a DRAM.

The effort of extending DRAM cell density beyond the 1 gigabit generation presents the challenge of providing adequate cell capacitance within the projected cell area. Since capacitance is directly related to the surface area of the capacitor's plates, decreasing feature sizes make it very difficult to maintain sufficient cell capacitance. A cell capacitance of greater than or equal to twenty-five femto farads ($\geq 25$ fF) is typically required in order to provide an adequate signal for sensing the stored charge over and above the anticipated noise levels. As memory cells are constructed to save precious chip space, they need to be configured in such a manner that the same data information can be stored and accessed.

An attractive means of maintaining the required storage ability is to implement a gain cell which provides an output current rather than a charge. Current sensing offers greater noise immunity and faster operation times than the conventional charge sense amplifier latch. One approach to this has been to provide a conventional, planar one transistor DRAM cell configuration to store charge on a planar diffused junction storage node. This node acts in turn as the gate of a lateral junction field-effect transistor (JFET) which is used to read the cell charge state.

An alternate approach is to construct a vertical cell with a surrounding gate write device wherein access to a read JFET is through a forward biased junction with the write bit line contact. The drawback to this method is that the forward biased junction causes the injection of minority carriers into the JFET channel which will then be collected largely by the storage node junction. Thus, the read operation of this device is destructive and transient.

For the reasons stated above, and for other reasons stated below which will become apparent to those skilled in the art upon reading and understanding the present specification, there is a need in the art for a memory cell structure for dynamic random access memory devices which provide increased cell density while maintaining adequate cell capacitance and charge retention times. There is further need for such a memory cell structure offering these advantages along with a non-destructive read function.

SUMMARY OF THE INVENTION

In one embodiment, a gain cell is provided. The gain cell includes a write transistor having multiple sides and a read transistor having multiple sides. The write transistor has a body region and first and second source/drain regions. The write transistor also has a gate that is associated with a first side of the write transistor. Similarly, the read transistor has a gate region, a body region and a first and second source/drain regions. The read transistor and the write transistor are formed in a vertical pillar of single crystalline semiconductor material the extends outwardly from a semiconductor substrate. A charge storage node surrounds a portion of the pillar adjacent to the second source/drain region of the write transistor. There is a write bit line coupled to the first source/drain region of the write transistor. A write wordline is coupled to the gate of the write transistor. A read bit line is coupled to the body region of the write transistor. And, a read wordline is coupled to second source/drain region of the read transistor.

In another embodiment, a gain cell is provided which has an n-channel transistor and a p-channel transistor. Both transistors have multiple sides. The n-channel vertical transistor has a body region and first and second source/drain regions. The n-channel transistor also has a gate that is associated with a first side of the n-channel transistor. Similarly, the p-channel transistor has a gate region, a body region and first and second source/drain regions. The n-channel transistor and the p-channel transistor are formed in a vertical pillar of single crystalline semiconductor material that extends outwardly from a semiconductor substrate. A charge storage node that surrounds a portion of the pillar adjacent to the second source/drain region of the n-channel transistor. There is a write bit line coupled to the first source/drain region of the n-channel transistor. A write wordline is coupled to the gate of the n-channel transistor. A read bit line is coupled to the body region of the n-channel transistor. And, a read wordline is coupled to second source/drain region of the p-channel transistor.

In another embodiment, a memory array on a substrate is provided. The memory array includes multiple vertical pillars of single crystalline semiconductor material extending outwardly from the substrate. The pillars have multiple sides, and each pillar includes a pair of transistors in the same pillar. Each of the transistors has a body region, a gate region and first and second source/drain regions. The second source/drain region of a first transistor comprises the gate for a second transistor. The first source/drain region of the second transistor comprises the body region of the first transistor. The pillars form an array of rows and columns. There are a number of write wordlines, wherein each write wordline is coupled to the gates of the first transistors in a row of vertical pillars in the array. A number of write bit lines are provided such that each write bit line is coupled to the first source/drain regions of the first transistors in a column of vertical pillars in the array. A charge storage node is coupled to the second source/drain region of each first transistor in the array of vertical pillars. There are also provided a number of read bit lines, such that each read bit line is coupled to the first source/drain regions of the second transistors in a row of vertical pairs in the array. A number of read wordlines are included such that each read wordline is coupled to the second source/drain regions of the second transistors in a column of vertical pillars in the array.

In another embodiment, a data storage device is provided. The data storage device includes a memory array having a plurality of gain cells. The memory array further includes multiple vertical pillars of single crystalline semiconductor material extending outwardly from the substrate. The pillars have multiple sides. Each pillar includes a pair of transistors in the same pillar. The transistors have a body region, a gate region and first and second source/drain regions. The second source/drain region of a first transistor comprises the gate for a second transistor, and the first source/drain region of the second transistor comprises the body region of the first transistor. The pillars form an array of rows and columns which also include a number of write wordlines, a number of write bit lines, a charge storage node on each pillar, a number of read bit lines, and a number of read wordlines.

Each write wordline is coupled to the gates of the first transistors in a row of vertical pillars in the array. Each write bit line is coupled to the first source/drain regions of the first transistors in a column of vertical pillars in the array. Each charge storage node is coupled to the second source/drain region of each first transistor in the array of vertical pillars. Each read bit line is coupled to the first source/drain regions of the second transistors in a row of vertical pairs in the array. And, each read wordline is coupled to the second source/drain regions of the second transistors in a column of vertical pillars in the array. A number of bit line drivers are coupled to the respective read and write bit lines. A number of wordline drivers are coupled to the respective read and write wordlines. A number of input/output controls are coupled to certain ones of the read and write bit lines and wordlines. And, a number of address decoders coupled to the read and write bit lines and wordlines.

In another embodiment, a method for reading a gain cell that includes a vertical read and a vertical write transistor formed in a single crystalline pillar of semiconductor material. The method includes receiving an address of a gain memory cell. Next, the method includes coupling a read bit line to a read wordline through the vertical read transistor, wherein a storage node on the cell acts as a gate for the vertical read transistor. Then, the method includes sensing the current that flows through the vertical read transistor.

In another embodiment, a method for fabricating a gain cell on a semiconductor substrate is provided. The method includes forming a vertical write transistor having multiple sides. The vertical write transistor is formed with a gate, a body region and first and second source/drain regions. The method includes forming a vertical read transistor having multiple sides. The vertical read transistor is formed with a body region and first and second source/drain regions. The vertical read transistor if formed having a gate region that couples to the second source/drain region of the vertical write transistor. A charge storage node is formed which couples to the second source/drain region of the vertical write transistor. A write bit line is formed that couples to the first source/drain region of the vertical write transistor. A write wordline is formed that couples to the gate region of the vertical write transistor. A read bit line is formed that couples to the first source/drain region of the vertical read transistor. And, a read wordline is formed that couples to the second source/drain region of the vertical read transistor.

In another embodiment, a method for fabricating a gain memory cell array is provided. The method includes forming multiple pillars of semiconductor material. The multiple vertical pillars of single crystalline semiconductor material are formed extending outwardly from the substrate. The pillars are formed with multiple sides. Each pillar includes a pair of transistors in the same pillar. Each of the transistors is formed having a body region, a gate region and first and second source/drain regions. The second source/drain region of a first transistor are formed to comprise the gate for a second transistor. The first source/drain region of the second transistor is formed to comprise the body region of the first transistor. The pillars are formed in an array of rows and columns. A number of write wordlines are formed such that each write wordline is coupled to the gates of the first transistors in a row of vertical pillars in the array. A number of write bit lines are formed such that each write bit line is coupled to the first source/drain regions of the first transistors in a column of vertical pillars in the array. A charge storage node is formed that couples to the second source/drain region of each first transistor in the array of vertical pillars. A number of read bit lines are formed such that each read bit line is coupled to the first source/drain regions of the second transistors in a row of vertical pairs in the array. And a number of read wordlines are formed such that each read wordline is coupled to the second source/drain regions of the second transistors in a column of vertical pillars in the array.

These various embodiments of the vertical gain cell structure can provide increased cell density. The gain cell can be fabricated in an area as small as four lithographic features ($4F^2$). The vertical gain cell structure is capable of combination with other memory devices in order to form an array. Also, the structure and method of fabrication yield a gain cell capable of non-destructive read operations and increased capacitance for greater data retention times.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. Also, the dimensions are representative only and not intended to be precise representations of actual manufactured structures. The following detailed description is, therefore, not to be taken in a limiting sense, and the scope of the present invention is defined only by the appended claims, along with the full scope of equivalents to which such claims are entitled.

Figure 1:
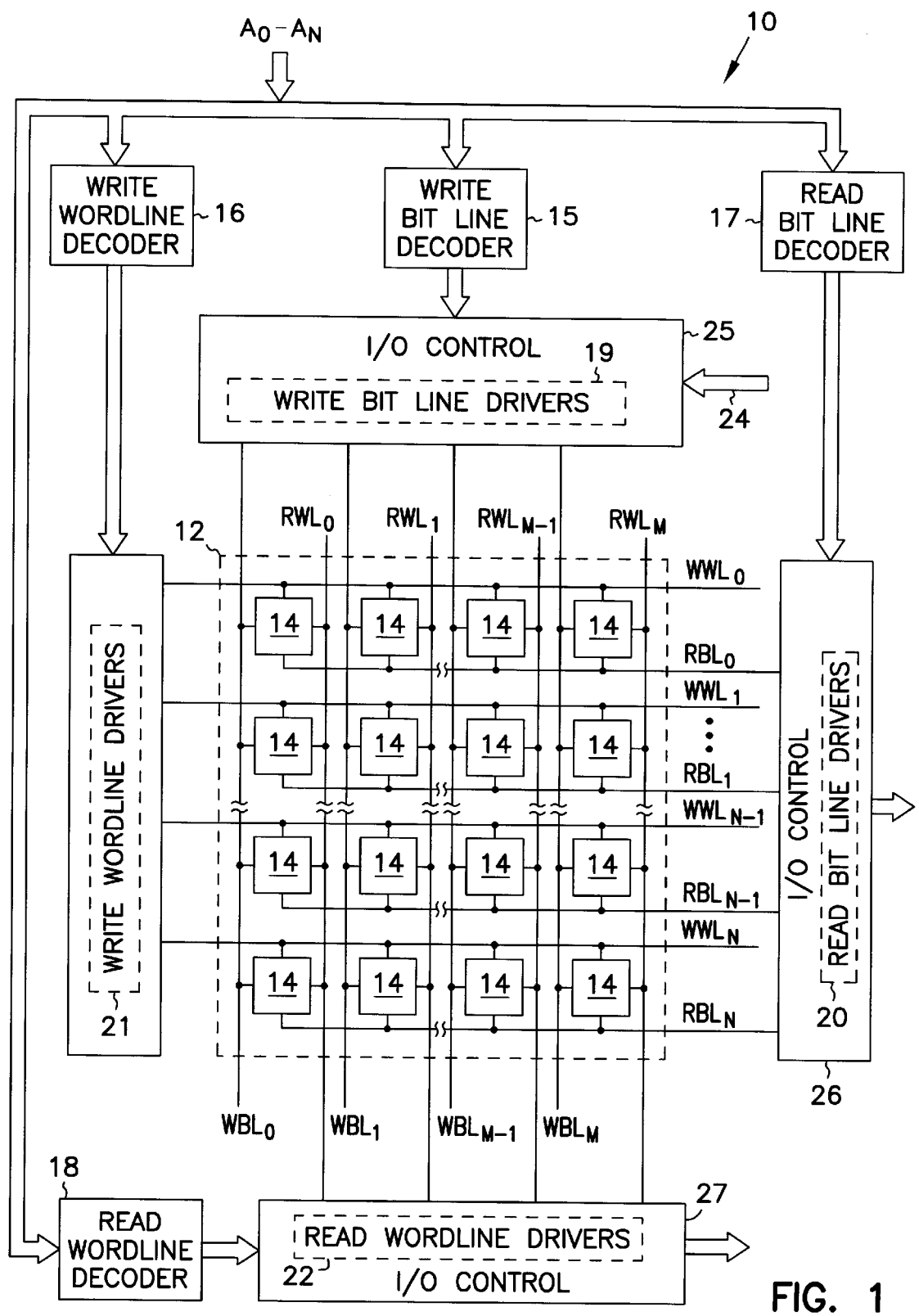
FIG. 1 is a block diagram of an embodiment of a memory device including a matrix of gain cells according to the teachings of the present invention.

FIG. 1 is a block diagram of an embodiment of a memory device 10 including a matrix or array 12 of gain cells 14 which form rows and columns according to the teachings of the invention. Each gain cell 14 comprises a vertical pillar of single crystalline semiconductor material. Each pillar includes a pair of transistors, a first transistor which performs as a write transistor and a second transistor which performs as a read transistor. In the exemplary embodiment, memory device 10 is a dynamic random access memory (DRAM). Array 12 has N rows and M columns. It is noted that N may equal M. Array 12 includes two sets of wordlines and two sets of bit lines. Within the N rows are found N rows of write wordlines $WWL_0$, $WWL_1$ ..., $WWL_{N-1}$, $WWL_N$, and there are N rows of read bit lines (data lines) $RBL_0$, $RBL_1$ ... $RBL_{N-1}$, $RBL_N$. Each of the N rows of write wordlines is coupled to the gates of the first transistors in a row of vertical pillars in the array 12. Each of the N rows of read bit lines is coupled to the first source/drain regions of the second transistors in a row of vertical pillars in the array 12.

In analogous fashion, there are M columns. Within the M columns there are located M write bit lines $WBL_0$, $WBL_1$ ... $WBL_{M-1}$, $WBL_M$ and there are M read wordlines $RWL_0$, $RWL_1$, ... $RWL_{M-1}$, $RWL_M$. Each of the M write bit lines is coupled to the first source/drain regions of the first transistors in a column of vertical pillars in the array 12. Each of the M read wordlines is coupled to the second source/drain regions of the second transistors in a column of vertical pillars in the array 12. The write bit lines $WBL_0$ through $WBL_N$ are used to write data into the gain cells 14 using conventional techniques. A row address is first selected and the associated write wordline goes high. Next, a write bit line is selected and data on that bit line is placed into the cell located at that intersection of the write bit line and write wordline. The write wordline next goes low, discontinuing the conduction within the gain cell 14. This act causes a charge storage node to be disconnected from the write bit line. The data is now isolated and caused to float on the charge storage node of the gain cell 14. Unlike a conventional memory device, data is read from array 12 using the read wordlines and read bit lines. To read data from a cell, either the read bit line or alternatively the read wordline is brought to a negative voltage while the other is kept at ground. A read current is subsequently produced in the gain cell 14. The magnitude of the read current is reflective of the data stored in the gain cell 14.

A write bit line driver 19 couples to the M columns of write bit lines. A read bit line driver 20 couples to the N rows of read bit lines. A write wordline driver 21 couples to N rows of write wordlines. A read wordline driver 22 couples to M columns of read wordlines. Input/output control circuits, 25, 26 and 27 respectively, control the input and output signals written to the M columns of write bit lines and read from the N rows of read bit lines or from the M columns of read wordlines respectively. Address decoders 15, 16, 17, and 18 respectively, decode incoming addresses and route data to the proper write or read bit and wordline drivers, 19, 20, 21 and 22 respectively.

Gain Cell

Figure 2:
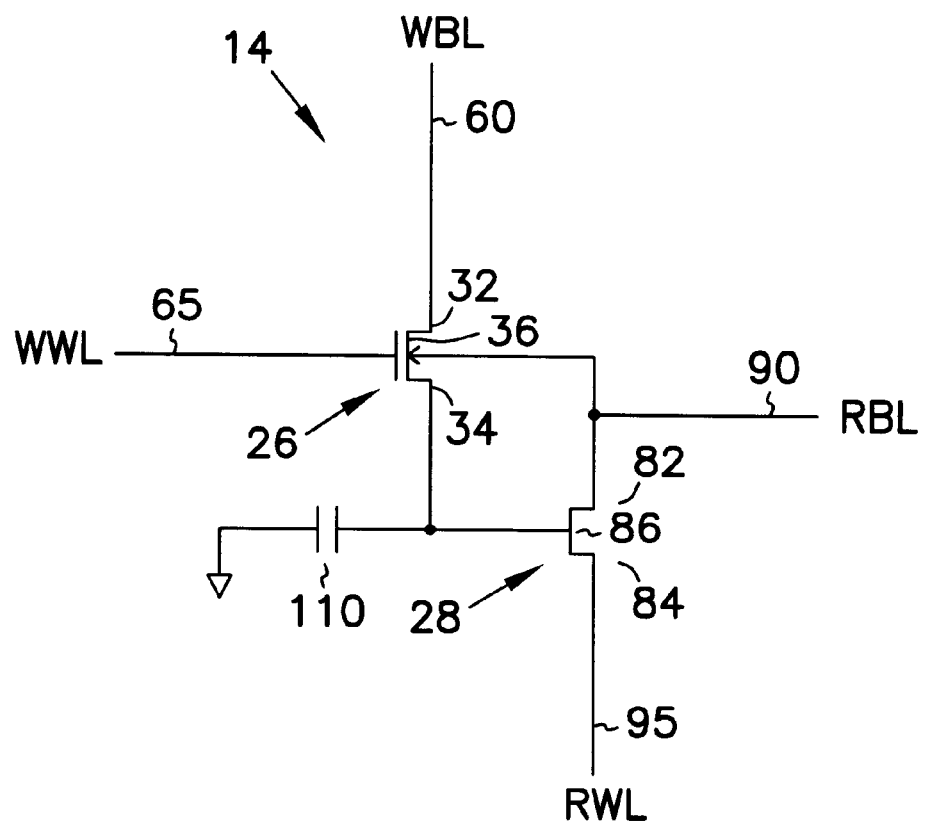
FIG. 2 is a schematic circuit diagram of an embodiment of a gain cell according to the teachings of the present invention.

FIG. 2 is a schematic circuit diagram of an embodiment of a gain cell. Each gain cell 14 includes a vertical write transistor 26, embodied as an n-channel metal-oxide semiconductor field-effect transistor (MOSFET), and a vertical read transistor 28, embodied as a p-channel junction field-effect transistor (JFET) 28. The write transistor 26 has first and second source/drain regions 32 and 34, respectively, and a body region 36. The first source/drain region 32 is coupled to write bit line (WBL) 60. A gate of transistor 26 is formed by the write wordline (WWL) 65. The write transistor 26 has a second source/drain region 34 coupled to a storage node 110. In one embodiment of FIG. 2, the charge storage node 110 is a capacitor.

The read transistor 28 has first and second source/drain regions 82 and 84, respectively, and a body region 86. The first source/drain region 82 is coupled to a read bit line 90. The second source/drain region 84 is coupled to a read wordline 95. Additionally, the second source/drain region 34 of the write transistor 26 comprises the gate of the read transistor 28. In one embodiment, the body region 36 of the write transistor 26 comprises the first source/drain region 82 of the read transistor 28. Together, the write and read transistor 26 and 28, respectively, form a vertical pillar of single crystalline semiconductor material 120, as can be seen in FIG. 3.

Figure 3:
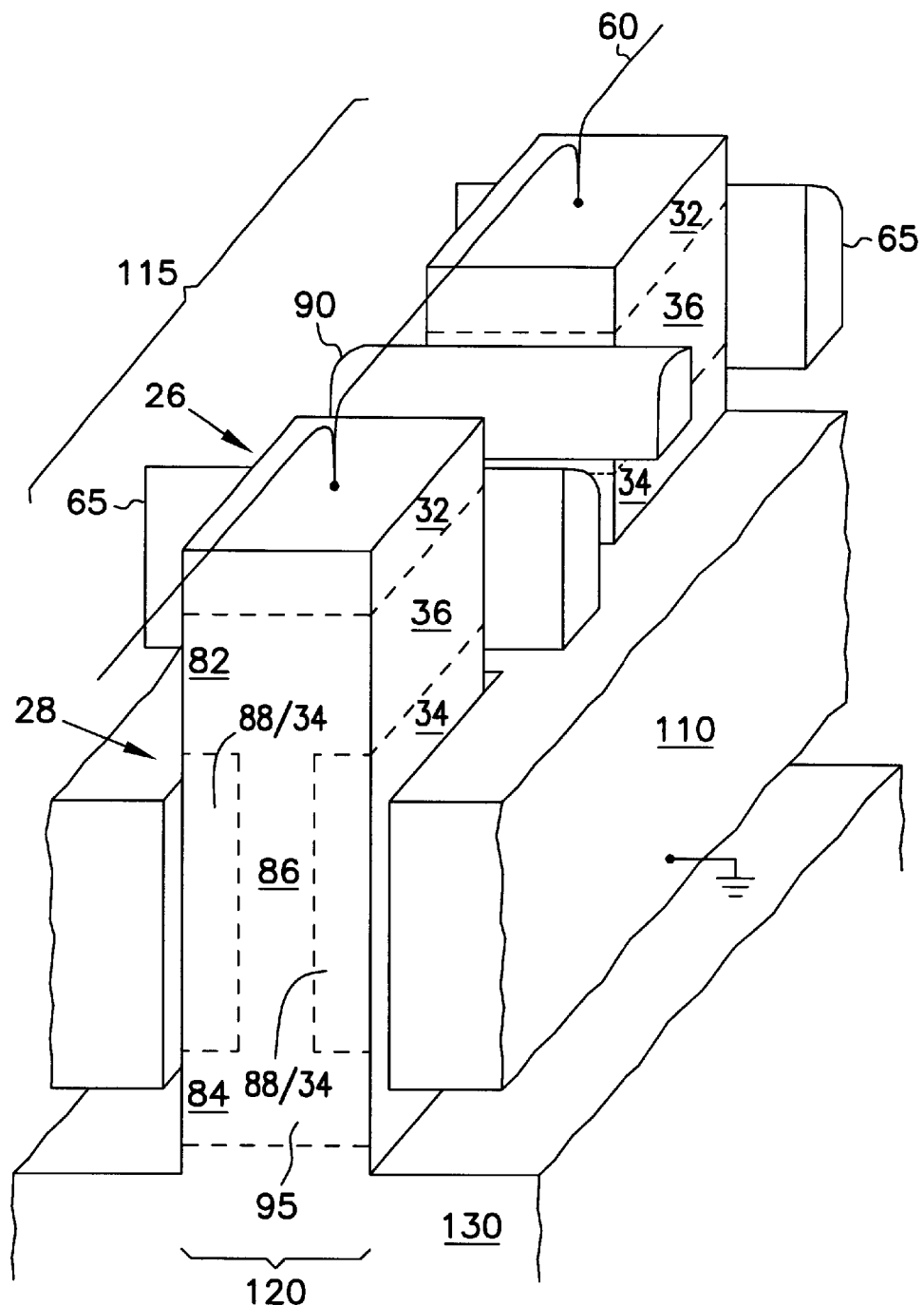
FIG. 3 is a perspective view of an embodiment of a gain cell according to the teachings of the present invention.

FIG. 3 is a perspective view of an embodiment of a gain cell 14 according to the teachings of the present invention. It is shown in FIG. 3 that each gain cell 14 comprises a pillar 120 of single crystalline semiconductor material, having multiple sides and extending outwardly from the substrate 130. The pillar 120 consists of a vertical write transistor 26 and a vertical read transistor 28, both within the same pillar. The body region 36 of the write transistor 26 also comprises the first source/drain region 82 for the read transistor 28. Additionally, the second source/drain region 34 of the write transistor 26 comprises the gate 88 for the read transistor 28.

FIG. 3 similarly illustrates the pillar's 120 structure in relation to the coupled write and read bit lines 60 and 90, respectively, as well as the write and read wordlines 65 and 95, respectively. The write bit line 60 is coupled to the first source/drain region 32 of the write transistor 26, and the read bit line 90 is coupled to the first source/drain region 82 of the read transistor 28. The write wordline 65 is coupled to the body region of the write transistor 26 but on a second side from the read bit line 90. The remaining read wordline 95 is coupled to the second source/drain region 84 of the read transistor 28. As shown in FIG. 3, a charge storage node 110 is located opposite the second source/drain region 34 of the write transistor 26. In one embodiment, the charge storage node 110 is a capacitor plate which surrounds the vertical pillar of single crystalline semiconductor material 120.

The operation of the read transistor 28 is controlled by the charge stored on the charge storage node 110. Essentially, the charge on the storage node 110 controls the conductivity of the read transistor. The conductivity of the read transistor 28 signifies a particular logic value on the charge storage node 110 of the gain cell 14. A p-n junction is formed between the second source/drain region 34 of the vertical write transistor 26 and the body region 86 of the vertical read transistor 28. This p-n junction creates a depletion zone between the second source/drain region 34 of the vertical write transistor and the body region 86 of the vertical read transistor 28.

Those skilled in the art will recognize the additional advantages to forming the pillars 120 as merged vertical pairs of write and read transistors, 26 and 28 respectively. As FIG. 3 illustrates, the charge storage node 110, the write wordline 65, the read wordline 95, the charge storage node 110 and the read bit line 90 are all formed beneath the silicon surface 115. The result is a memory cell 14 which can be made in an area as small as four lithographic features ($4F^2$). Similarly, the surrounding charge storage node 110 provides increased capacitance for increased data retention time, above that found in conventional gain cells. Further, the inclusion of an independent read bit line 90 provides for a nondestructive read operation.

Operation

In operation, writing data to the memory cell 14 is achieved using a conventional technique. In the write mode, the write bit line 60 is brought to a desired voltage level corresponding to "1" or "0". Next, the write wordline 65 is brought to a high voltage level, permitting conduction within the vertical write transistor 36. This action couples the logic value on the write bit line the charge storage node 110. During this sequence, the read wordline 95 is grounded. The write bit line 60 and the write wordline 65 voltage levels are limited between ground and $V_{DD}$.

In the read operation, either read wordline 95 or read bit line 90 is brought to a negative voltage level while the other is kept at ground. The potential difference established between the read bit line 90 and the read wordline 95 creates a readout current which corresponds to the data, or logic value, stored on the charge storage node 110. The readout current produced by the read transistor 28 is controlled by the charge present on the charge storage node 110 due to the p-n junction which exists between the second source/drain region 34 of the vertical write transistor 26 and the body region 86 of the vertical read transistor. A depletion zone is formed between these two regions. The presence of a high voltage level, or logic 1, on the charge storage node has the effect of increasing the penetration of the depletion zone into the body region 86 of the vertical read transistor.

In a standby mode, both the write wordline 65, the read wordline 95, the write bit line 60, and the read bit line 90 are all brought to ground so that the charge storage node is isolated, current flow is cut off, and the logic value on the charge storage node is kept floating.

When either the read bit line 90 or read wordline 95 is brought negative, the depletion region existing between the second source/drain region 34 of the vertical write transistor 26 and the body region 86 of the vertical read transistor 28 increases. One skilled in the art will recognize, the silicon pillar size, charge storage node shape, and impurity concentration, can be selected so as to produce the situation in which the depletion zone entirely penetrates the body region 86 and cuts off current flow between the first and second source/drain regions, 82 and 84 respectively, of the read transistor 28. Conversely, if the charge or data held by the charge storage node 110 was a logic 0, current will still be able to flow. Hence, the conductivity of the read transistor 28 is interpreted to represent a particular logic value on the charge source node 110 of the memory cell.

Fabrication of the Gain Cell

Figure 4A:
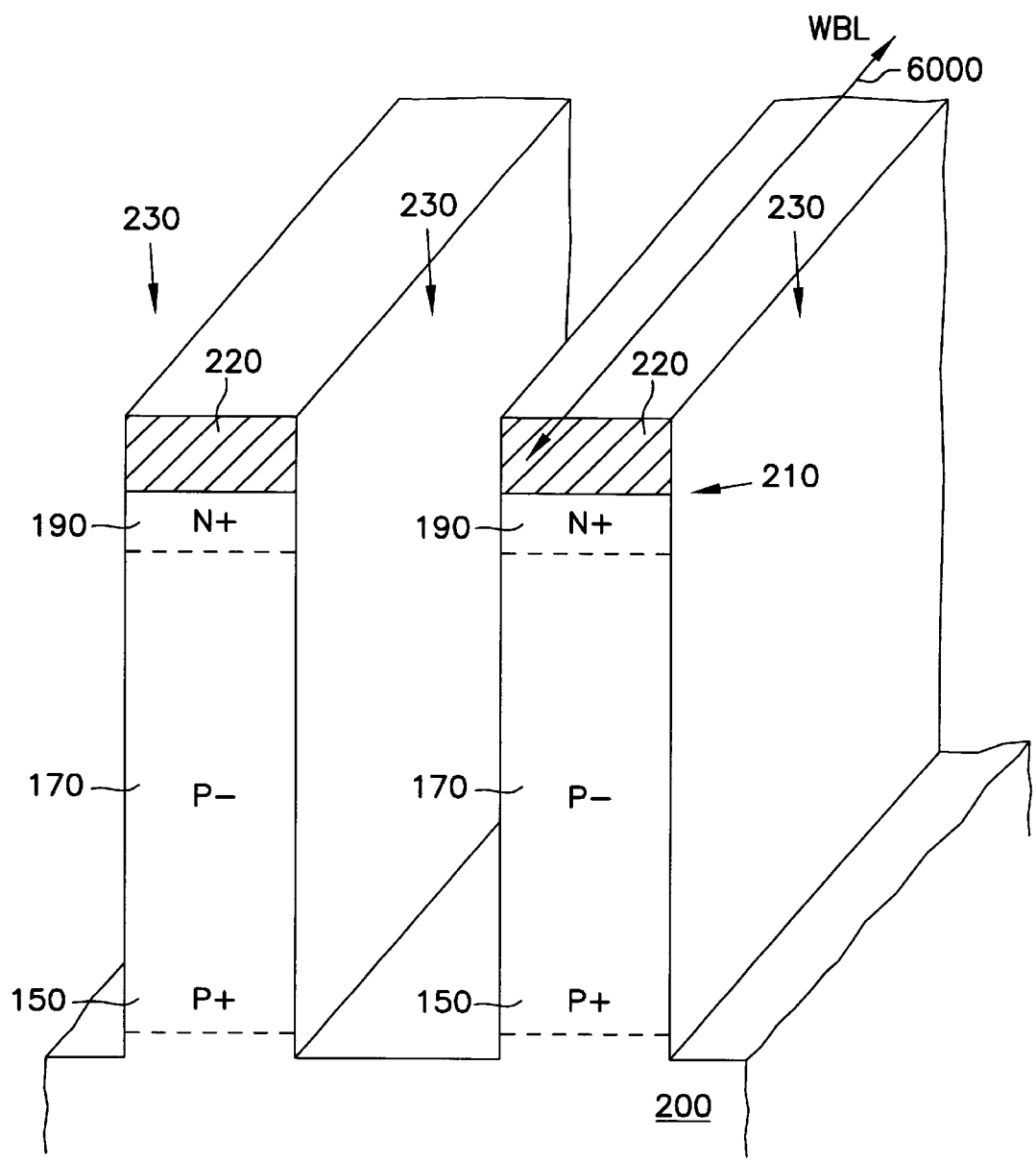
FIGS. 4A, 4B, 4C, 4D, 4E, 4F and 4G are perspective views that illustrate an embodiment of a process for fabricating an array of gain cells.

FIGS. 4A–4G are perspective views illustrating an embodiment of a process for fabricating an array of gain cells. FIG. 4A shows one embodiment which begins with an n-type silicon substrate wafer 200. Next, a p+ layer 150 is grown upon the n-type silicon substrate wafer 200. The p+ layer 150 is grown through epitaxial growth to a thickness of approximately 0.2 micrometers (elm). This is followed by growing a layer of p− silicon 170 on the p+ layer 156. The p− layer 170 is grown through epitaxial growth to a thickness of approximately 1.0 micrometers ($\mu$m). An n+ layer 190 is formed on the p− layer 170 by ion implantation. The n+ layer 190 has a thickness of approximately 0.15 micrometers ($\mu$m). An oxide layer 210, formed of silicon dioxide ($SiO_2$), is grown on the n+ layer 190. A nitride layer 220, formed of silicon nitride ($Si_2N_3$), is then deposited on the oxide layer 210. The nitride deposition can be performed by chemical vapor deposition (CVD).

A photoresist is applied and selectively exposed to provide a mask to define a stripe pattern in the write bit line (WBL) direction which is indicated by arrow 6000. The nitride layer 220, oxide layer 210 and n-type substrate 200 are etched through, such as by reactive ion etching (RIE), such that the n-type substrate 200 is exposed to form a first set of trenches 230. The structure is now as shown in FIG. 4A.

Figure 4B:
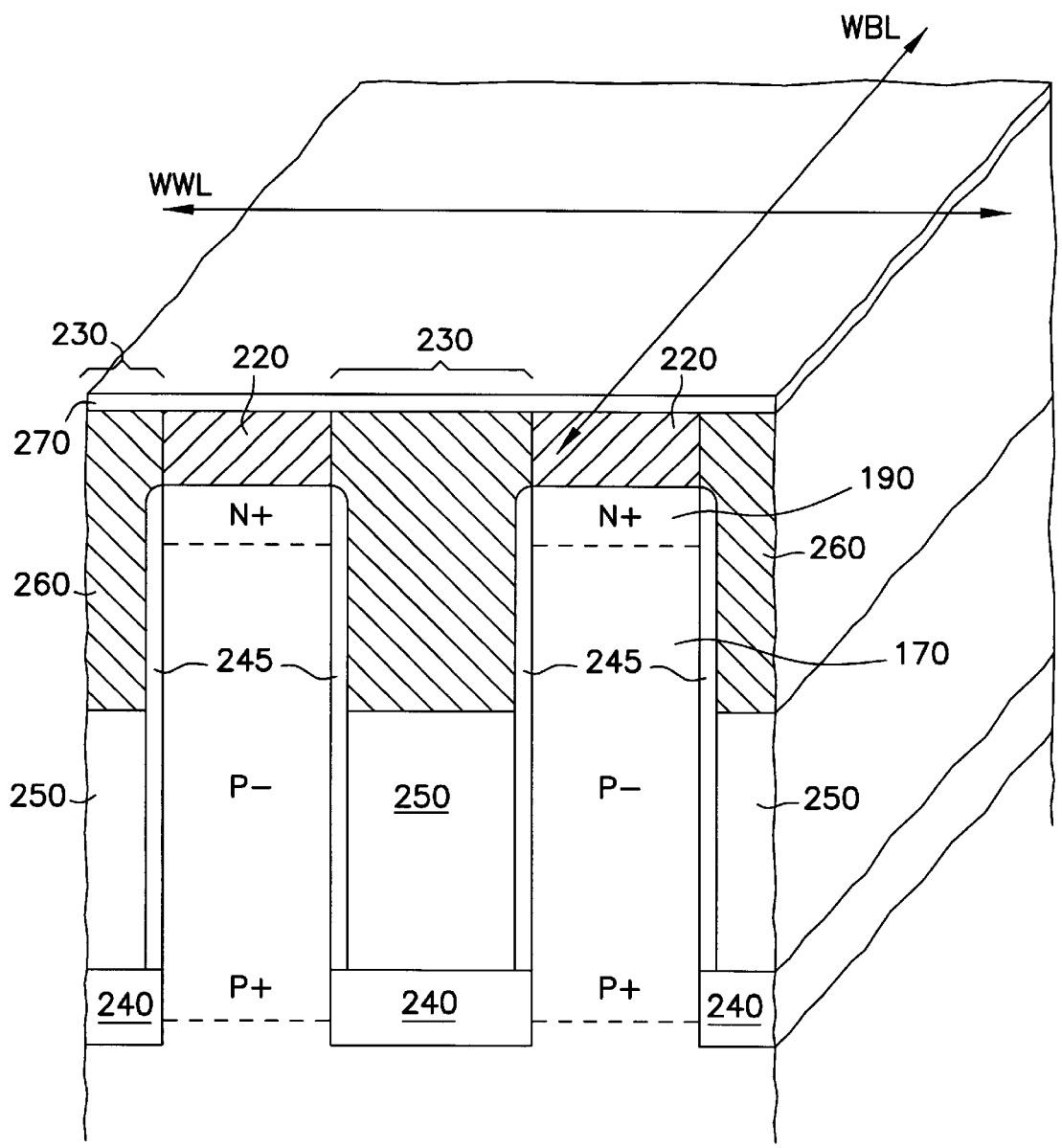

FIG. 4B shows the structure after the next sequence of steps. Trenches 230 are filled with an oxide 240. The oxide 240 may be deposited through any suitable process, such as CVD. Next, the oxide 240 is etched back to leave at a point above the lower p-n junction by approximately 0.2 micrometers. A pad oxide 245, approximately 10 nanometers (nm) in thickness, is thermally grown on the exposed walls of the trenches 230. Intrinsic polysilicon 250 is deposited by CVD to fill the trenches 230. The intrinsic polysilicon 250 is etched back through a process such as reactive ion etching to recess it to approximately 0.3 micrometers below the p-n junction formed between the n+ layer 190 and the p− layer 170. A nitride layer 260 is deposited by CVD to fill the remaining portion of the trenches 230. The nitride 260 is planarized such as by the process of chemical-mechanical polishing/planarization (CMP). An oxide cap layer 270 is deposited on the nitride layer 260 by CVD. The thickness of the oxide cap layer 270 is approximately 50 nanometers. The structure is now as shown in FIG. 4B.

Figure 4C:
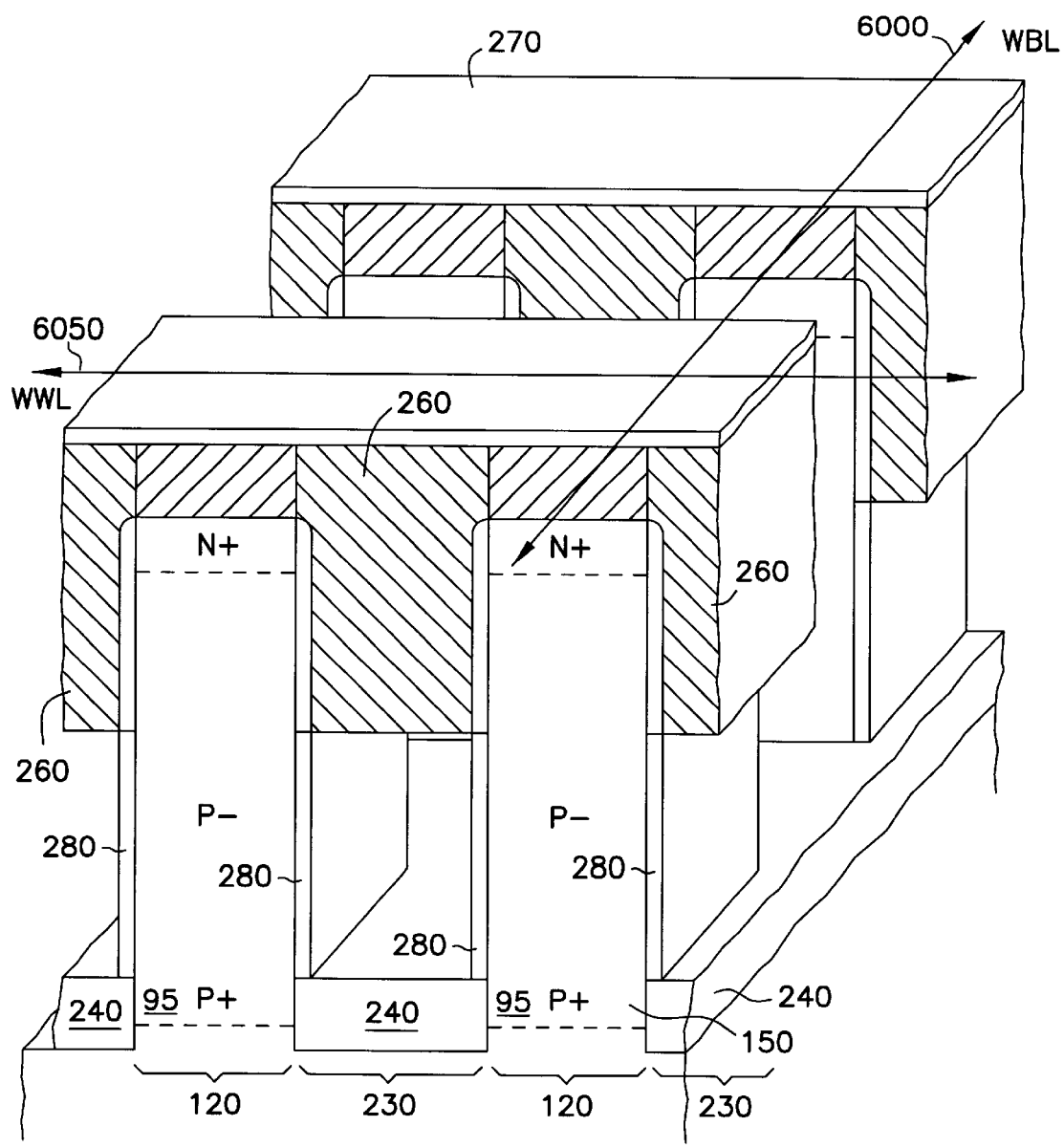

FIG. 4C illustrates the structure after the next sequence of steps. A photoresist is applied and selectively exposed to create a mask to define a stripe pattern in the write wordline (WWL) direction, as indicated by arrow 6050. The cap oxide 270 and nitride 260 are etched to a sufficient depth to expose the pillar 120 of single crystalline semiconductor material. The intrinsic polysilicon 250 is left covered. The single crystalline silicon pillar 120 is selectively etched to reach the p+ layer 150. The photoresist is removed such as by conventional photoresist stripping techniques. A pad oxide layer is thermally regrown on the exposed walls of the pillars 120 where it was removed in the above etching steps. The remaining nitride 260 is directionally etched in the write wordline (WWL) direction, as indicated by arrow 6050, using the cap oxide 270 as a mask. The remaining nitride is etched through to the point where the underlying intrinsic polysilicon 250 is exposed. Next, the intrinsic polysilicon 250 is isotropically etched using an etchant known in the art to selectively attack only the intrinsic polysilicon 250. All of the intrinsic polysilicon 250 is removed through etching, leaving a nitride bridge 260 across the pillars 120. A timed isotropic oxide etch is performed to remove all exposed thin oxide 245 from the walls of the pillars 120. The isotropic oxide etch leaves the thick oxide 240 at the bottom of the trenches 230. Arsenic (As) or phosphorus (P) doped glass 280 is deposited, such as by CVD, in the trenches 430 as a dopant source. The doped glass 280 is deposited to a thickness of approximately 60 nanometers. The doped glass 280 is reactive ion etched (RIE) to leave on the walls of the pillars 120 only. The structure is now as shown in FIG. 4C.

Figure 4D:
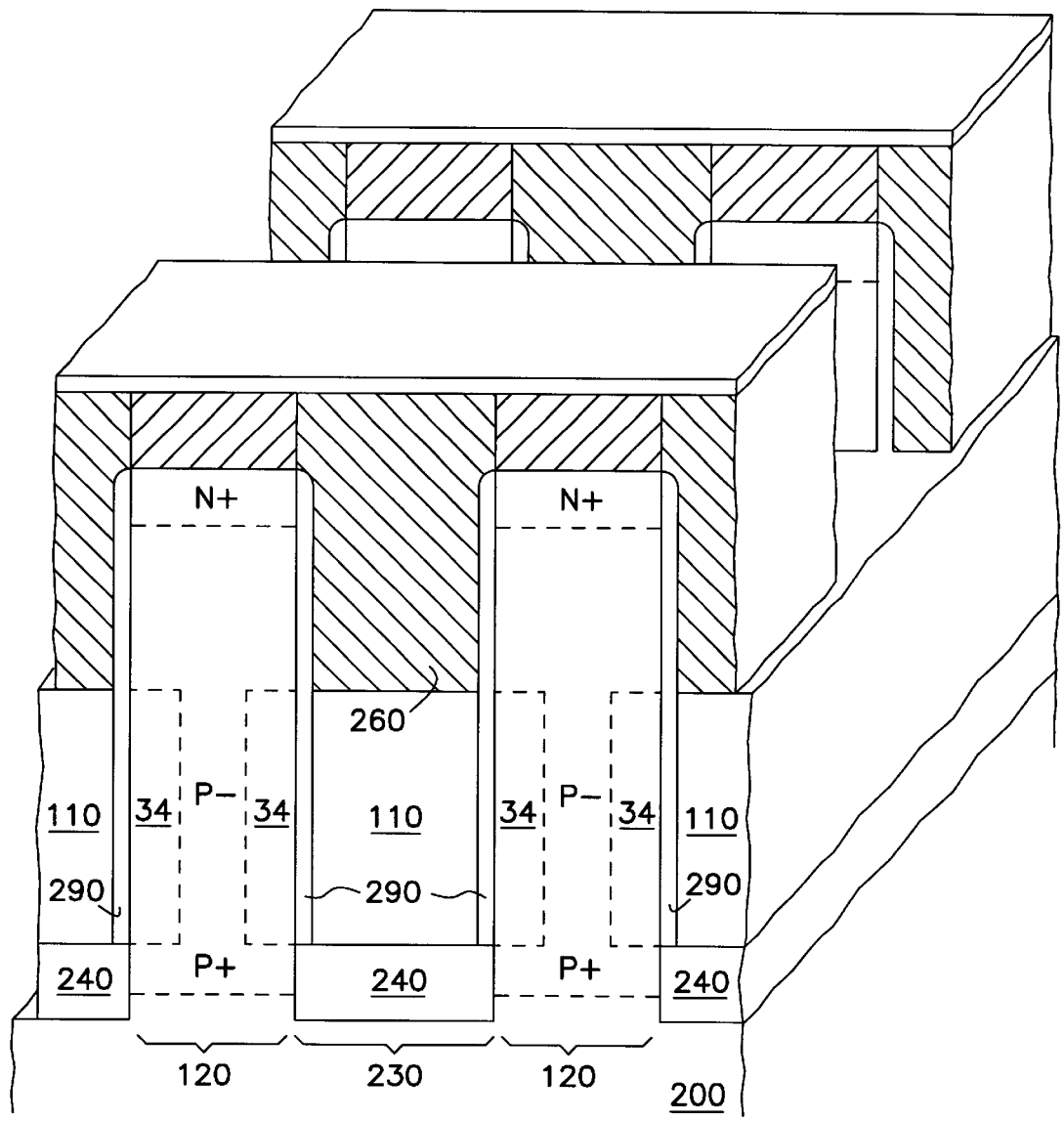

FIG. 4D shows the structure after the completion of the next sequence of steps. The trenches 230 are filled with a photoresist, which is then etched back to a level approximately 0.1 micrometers above the bottom of the nitride bridge 260. The doped glass is isotropically etched to remove the doped glass 280 from the top of the walls of the pillars 120. The photoresist is next removed using conventional processes. The doped glass that still remains on the walls of the pillars 120 serves as a source of dopant which is diffused into the walls of the pillars 120 to form an n+ region 34. The residual doped glass is then removed by isotropic etching. A dielectric insulator 290 is formed on the walls of the pillars 120 opposite the n+ region 34. The dielectric insulator 290 can be formed either through deposition in a CVD process or, in an alternative embodiment, it may be grown such as by thermal oxidation. Next, a charge storage node 110 is formed in the trenches 230. The charge storage node 110 is deposited by chemical vapor deposition, planarized and etched back to a level even with the bottom of the nitride bridge 260. In one embodiment, the charge storage node 110 is formed of n+ polysilicon. In another embodiment, the charge storage node 110 is formed from any other suitable refractory conductor. The structure is now as illustrated in FIG. 4D.

Figure 4E:
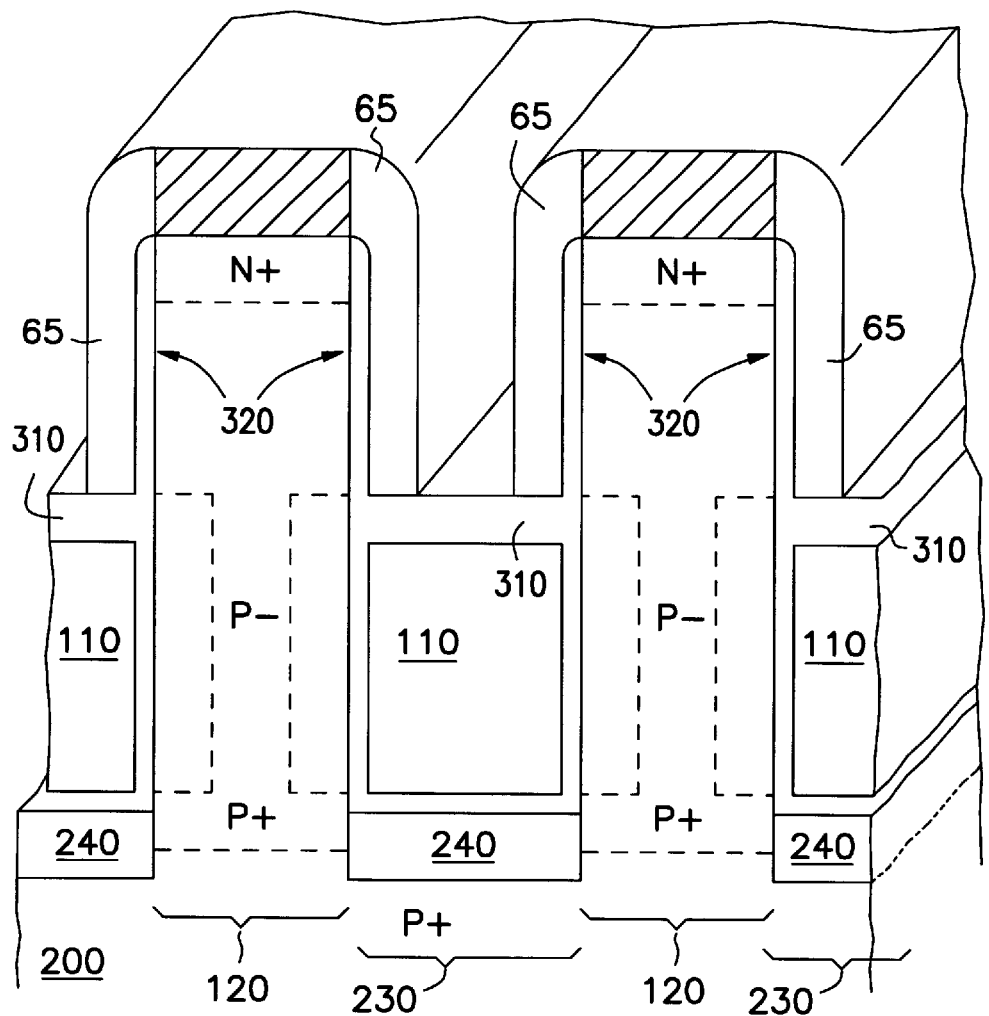

FIG. 4E illustrates the structure after the next sequence of process steps. This sequence begins with etching to strip the remaining dielectric insulator 290 from the walls of the pillars 120. A nitride layer is formed, such as through the process of CVD. The nitride layer is formed to a thickness of approximately 20 nanometers. The nitride layer is directionally etched to leave only on the vertical walls of the trenches 230. An oxide layer 310 is thermally grown on the exposed charge storage node 110. The nitride layer is then stripped away using conventional processes. An oxide layer 320 is thermally grown on the walls of the pillars 120. A write wordline 65 is deposited by a process such as CVD. In one embodiment, the write wordline 65 is formed of n+ polysilicon. The write wordline 65 is formed to a thickness of equal to or less than one-third the minimum lithographic dimension (the feature size "F"). The write wordline 65 is directionally etched to leave the write wordline 65 on the walls of the pillars 120. The structure is now as shown in FIG. 4E.

Figure 4F:
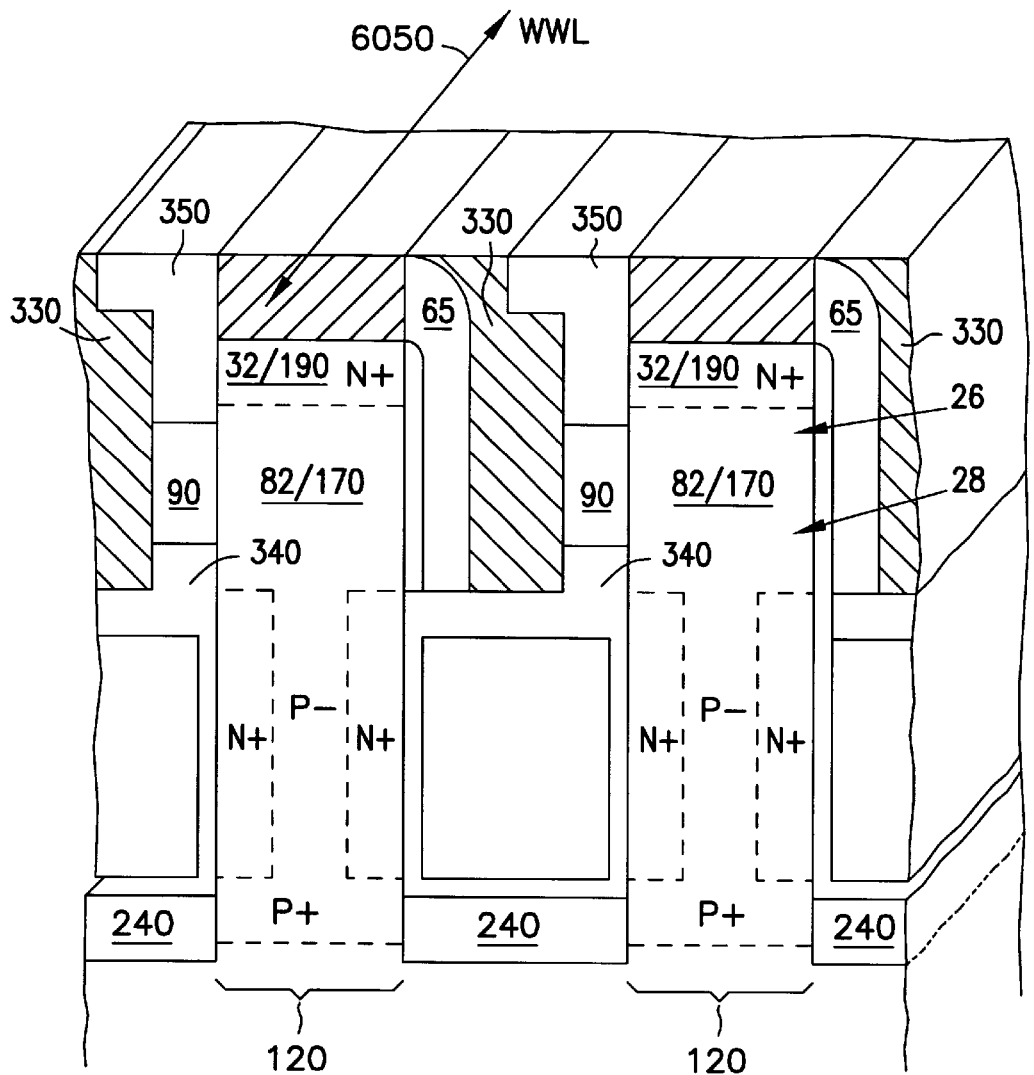

FIG. 4F illustrates the structure after the next series of steps in the fabrication process. A nitride layer 330 is deposited by chemical vapor deposition (CVD). The nitride layer 330 fills the space in the trenches 230 between the write wordlines 65 and is then planarized by such a process as chemical-mechanical planarization/polishing (CMP). A photoresist is applied and selectively exposed to provide a mask which defines strips along the write wordline 65 direction. The mask covers a wordline 65 on a first side of each of the walls of the pillars 120. The nitride layer 330 is directionally etched to a sufficient depth to expose the tops of the write wordline 65. The etching may be performed by any suitable process, such as RIE. The exposed write wordline 65 is selectively etched to remove that write wordline 65. The photoresist is then removed by conventional techniques. An oxide layer 340 is deposited and planarized to fill the space of the removed wordline 65. The oxide layer 340 is directionally etched to recess the oxide layer to expose the p– layer 170. A read bit line 90 is deposited by, for example, CVD in the recesses. In one embodiment, the read bit line 90 is formed of p+ polysilicon. The read bit line 90 is etched below the top p-n junction, formed at the top of the pillar 120 between the n+ 190 and the p– layer 170. An oxide layer 350 is deposited by, for example, CVD to cap the read bit line 90. The oxide layer 350 is planarized, by for example CMP, stopping on nitride layer 330. The structure is now as illustrated in FIG. 4F.

Figure 4G:
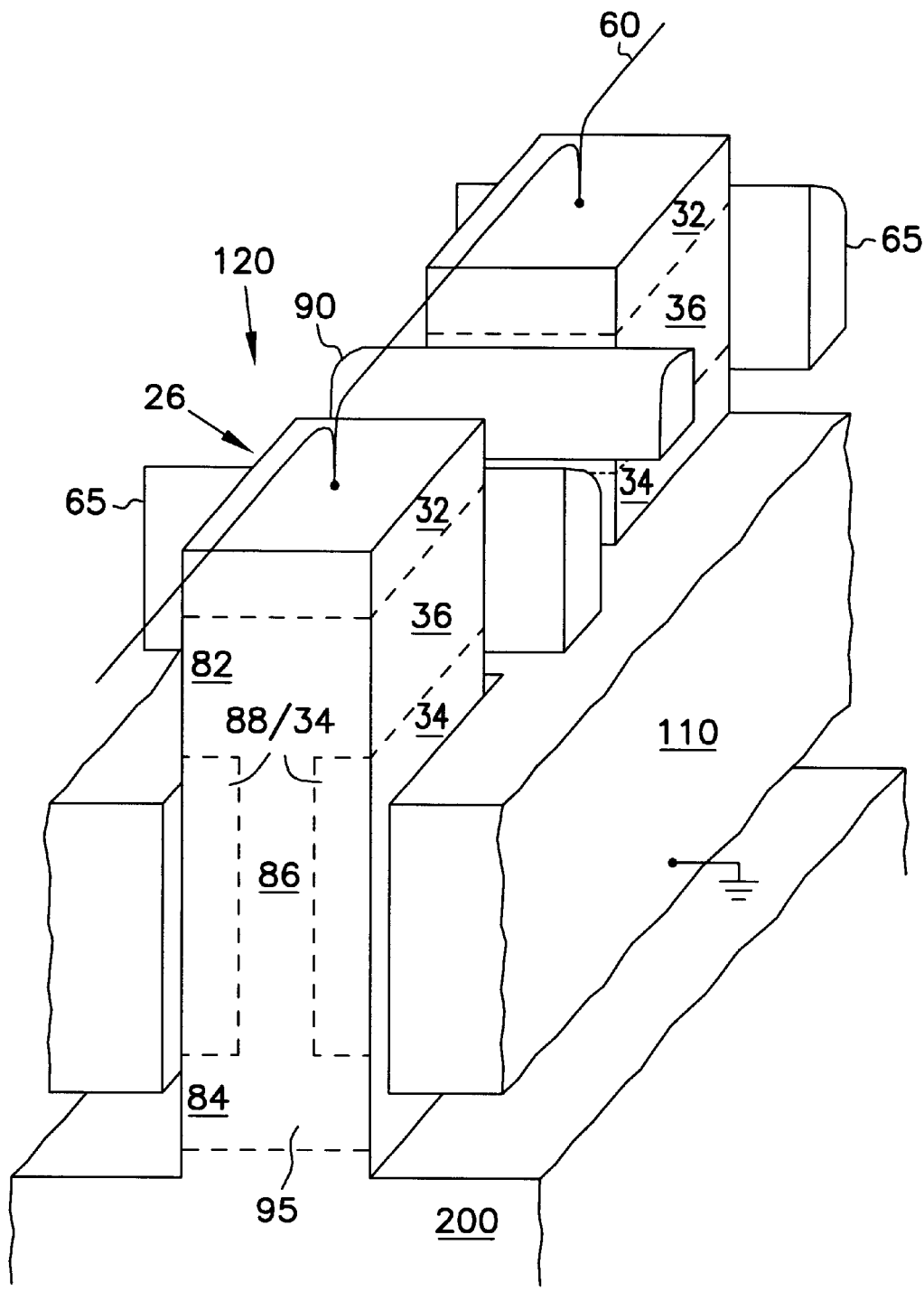

FIG. 4G illustrates a perspective view of the completed structure following the next sequence of steps. The remaining nitride 330 has been stripped with an isotropic wet etch. The isotropic wet etch can be performed through the use of phosphorus acid. The write wordline 65 is then etched to recess the write wordline 65 below the top surface of the pillar 120.

CONCLUSION

It is to be understood that the above description is intended to be illustrative, and not restrictive. Combinations of the above embodiments, and other embodiments will be apparent to those of skill in the art upon reviewing the above description. The above structures and fabrication methods have been described, by way of example, not by way of limitation, with respect to the transistors, gain memory cell, memory cell array and memory device. However, the scope of the invention includes any other integrated circuit applications in which the above structures and fabrication methods are used. Thus, the scope of the invention is not limited to the particular embodiments illustrated and described herein. The scope of the invention should be determined with reference to the appended claims, along with the full scope of equivalents to which such claims are entitled.

What is claimed is:

1. A gain cell, comprising:
  a write transistor having multiple sides, the write transistor having a body region and first and second source/drain regions, the write transistor further having a gate that is associated with a first side of the write transistor;
  a read transistor having multiple sides, the read transistor having a gate region, a body region and a first and second source/drain regions, wherein the read transistor and the write transistor are formed in a vertical pillar of single crystalline semiconductor material the extends outwardly from a semiconductor substrate;
  a charge storage node that surrounds a portion of the pillar adjacent to the second source/drain region of the write transistor;
  a write bit line coupled to the first source/drain region of the write transistor;
  a write wordline coupled to the gate of the write transistor;
  a read bit line coupled to the body region of the write transistor; and
  a read wordline coupled to second source/drain region of the read transistor.

2. The gain cell according to claim 1, wherein the body region of the write transistor serves as the first source/drain region of the read transistor.

3. The gain cell according to claim 1, wherein the read transistor conducts when a first voltage level is present on the charge storage node, and the read transistor is non-conductive when a second voltage level is present on the charge storage node.

4. The gain cell according to claim 1, wherein the charge stored on the charge storage node controls the operation of the read transistor.

5. The gain cell according to claim 1, wherein the write transistor is a metal-oxide semiconductor field-effect transistor (MOSFET), and wherein the read transistor is a junction field-effect transistor (JFET).

6. The gain cell according to claim 1, wherein the write word line couples to a first side of the body region of the write transistor, and wherein the read bit line couples to a second side of the body region of the write transistor.

7. The gain cell according to claim 1, wherein the read wordline is buried beneath the vertical pillar of single crystalline semiconductor material.

8. The gain cell according to claim 1, wherein the write wordline and the read bit line are on opposing sides of the vertical pillar of single crystalline semiconductor material.

9. The gain cell according to claim 1, wherein the write wordline and the read bit line are orthogonal to the write bit line and the read wordline.

10. The gain memory cell according to claim 1, wherein the charge storage node is a plate capacitor which circumferentially surrounds the vertical pillar adjacent to the second source/drain region of the vertical write transistor.

11. A gain cell comprising:
   an n-channel transistor having multiple sides, the n-channel vertical transistor having a body region and first and second source/drain regions, and the n-channel transistor having a gate that is associated with a first side of the n-channel transistor;
   a p-channel transistor having multiple sides, the p-channel vertical transistor having a gate region, a body region and first and second source/drain regions, wherein the n-channel transistor and the p-channel transistor are formed in a vertical pillar of single crystalline semiconductor material that extends outwardly from a semiconductor substrate;
   a charge storage node that surrounds a portion of the pillar adjacent to the second source/drain region of the n-channel transistor;
   a write bit line coupled to the first source/drain region of the n-channel transistor;
   a write wordline coupled to the gate of the n-channel transistor;
   a read bit line coupled to the body region of the n-channel transistor; and
   a read wordline coupled to second source/drain region of the p-channel transistor.

12. The gain memory cell according to claim 11, wherein the n-channel transistor is a MOSFET and wherein the p-channel transistor is a JFET.

13. The gain memory cell according to claim 11, wherein the body region of the n-channel transistor also serves as the first source/drain region of the p-channel transistor, and wherein the second source/drain region of the n-channel transistor serves as the gate for the p-channel transistor.

14. The gain cell according to claim 11, wherein the read wordline is buried beneath the vertical pillar of single crystalline semiconductor material.

15. The gain cell according to claim 11, wherein the write wordline and the read bit line are on opposing sides of the vertical pillar of single crystalline semiconductor material.

16. The gain cell according to claim 11, wherein the write wordline and the read bit line are orthogonal to the write bit line and the read wordline.

17. The gain cell according to claim 11, wherein the read bit line couples to the body region of the n-channel transistor and the read wordline couples to the second source/drain region of the p-channel vertical transistor.

18. The gain cell according to claim 11, wherein the charge storage node is a plate capacitor which circumferentially surrounds the vertical pillar opposite the second source/drain region of the n-channel transistor.

19. The gain cell according to claim 11, wherein the charge on the charge storage node controls the conductivity of the p-channel transistor, and wherein the conductivity of the p-channel transistor signifies a particular logic value on the charge storage node of the memory cell.

* * * * *

UNITED STATES PATENT AND TRADEMARK OFFICE
CERTIFICATE OF CORRECTION

PATENT NO. : 6,246,083 B1
DATED : July 25, 2001
INVENTOR(S) : Wendell P. Noble

It is certified that error appears in the above-identified patent and that said Letters Patent is hereby corrected as shown below:

Title page, Title, and Column 1, line 2,
Insert -- AND METHOD FOR FORMING THE SAME -- after "MEMORY".

Column 2,
Line 35, delete "that" between "node" and "surrounds".

Column 3,
Line 31, insert -- are -- between "decoders" and "coupled".
Line 50, "if formed" should read -- is formed --.

Column 10, claim 1,
Line 43, "the extends" should read -- that extends --.

Signed and Sealed this

Fifteenth Day of January, 2002

Attest:

Attesting Officer

JAMES E. ROGAN
Director of the United States Patent and Trademark Office